(12) United States Patent
Nakayama

(10) Patent No.: US 8,102,467 B2
(45) Date of Patent: Jan. 24, 2012

(54) CAMERA MODULE AND IMAGING DEVICE

(75) Inventor: Takehiko Nakayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 358 days.

(21) Appl. No.: 12/448,942

(22) PCT Filed: Dec. 3, 2008

(86) PCT No.: PCT/JP2008/071966
§ 371 (c)(1),
(2), (4) Date: Aug. 5, 2009

(87) PCT Pub. No.: WO2009/072523
PCT Pub. Date: Jun. 11, 2009

(65) Prior Publication Data
US 2010/0007757 A1    Jan. 14, 2010

(30) Foreign Application Priority Data
Dec. 3, 2007  (JP) .................. 2007-312023

(51) Int. Cl.
*H04N 5/225* (2006.01)
*G03B 17/02* (2006.01)
*H01J 40/14* (2006.01)
*H01J 5/02* (2006.01)

(52) U.S. Cl. ........ 348/373; 348/374; 348/376; 348/340; 396/535; 250/239

(58) Field of Classification Search .......... 348/373–376, 348/207, 335, 337, 241, 340, 207.99, 222.1, 348/333.1, 344; 396/421, 428, 315; 250/239
See application file for complete search history.

(56) References Cited

U.S. PATENT DOCUMENTS
2003/0007084 A1    1/2003  Nakjoh
(Continued)

FOREIGN PATENT DOCUMENTS
JP    07-193738    7/1995
(Continued)

OTHER PUBLICATIONS
International Search Report; International Application No. PCT/JP2008/071966; Dated: Mar. 10, 2009.
(Continued)

*Primary Examiner* — Jason Chan
*Assistant Examiner* — Stephen Coleman
(74) *Attorney, Agent, or Firm* — Rader, Fishman & Grauer PLLC

(57) ABSTRACT

Provided are a camera module and electronic equipment that are advantageous in alleviating a stress to be imposed on connectors and a flexible substrate at the time of attaching a printed wiring substrate. A first flank 44 of a lens barrel 22 and a second flank 46 thereof intersect each other. An image sensor 26 is mounted with the back surface 26A thereof directed to a flexible substrate. A signal processing unit 30 is formed on a rigid printed wiring substrate 32. A flexible substrate 28 has a projecting portion 50 that projects from an intersectional part 48 at which the first flank 44 and second flank 46 intersect each other. The printed wiring substrate 32 is disposed on the second flank 46 via a temporary lock mechanism 54. The projecting portion 50 of the flexible substrate 28 is folded at the intersectional part 48, a flexible substrate-side connector 52 is coupled to a printed wiring substrate-side connector 56, and an adhesive layer 58 is bonded to the second flank 46. The flexible substrate 28 and printed wiring substrate 32 are thus mounted on the lens barrel 22.

9 Claims, 9 Drawing Sheets

U.S. PATENT DOCUMENTS

2007/0120050 A1    5/2007    Sawahata et al.

FOREIGN PATENT DOCUMENTS

| JP | 2000-207497 | 7/2000 |
| JP | 2004-274164 A | 9/2004 |
| JP | 2005-157107 | 6/2005 |
| JP | 2006-166202 | 6/2006 |
| JP | 2006-217475 | 8/2006 |
| JP | 2006-254310 | 9/2006 |

OTHER PUBLICATIONS

Extended European Search Report issued Nov. 29, 2010 for corresponding European Application No. 08 85 7727.

English Translation of the International Search Report issued Aug. 10, 2010 for International Application No. PCT/JP2008/071966.

[FIG. 1]
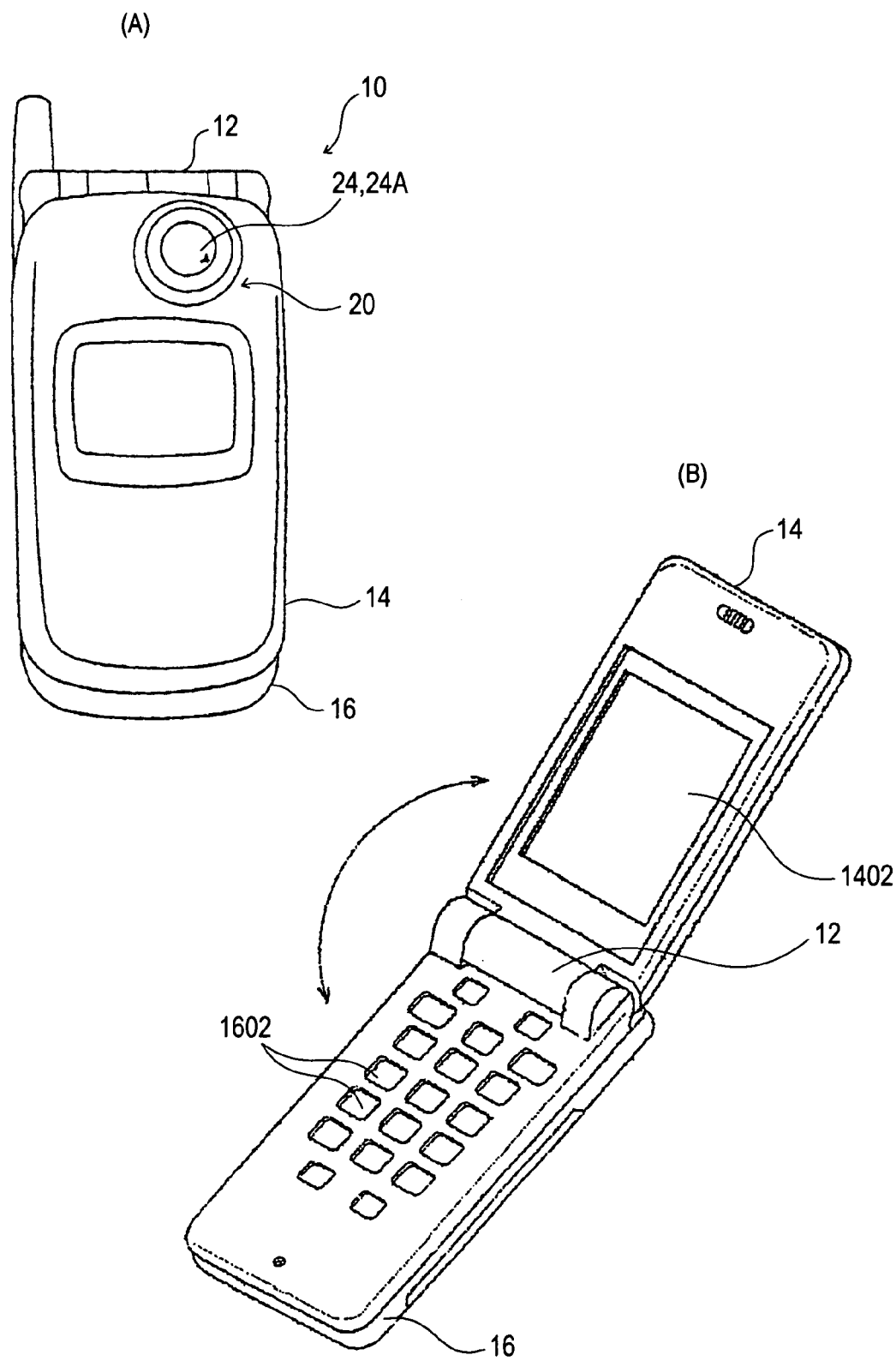

[FIG. 2]
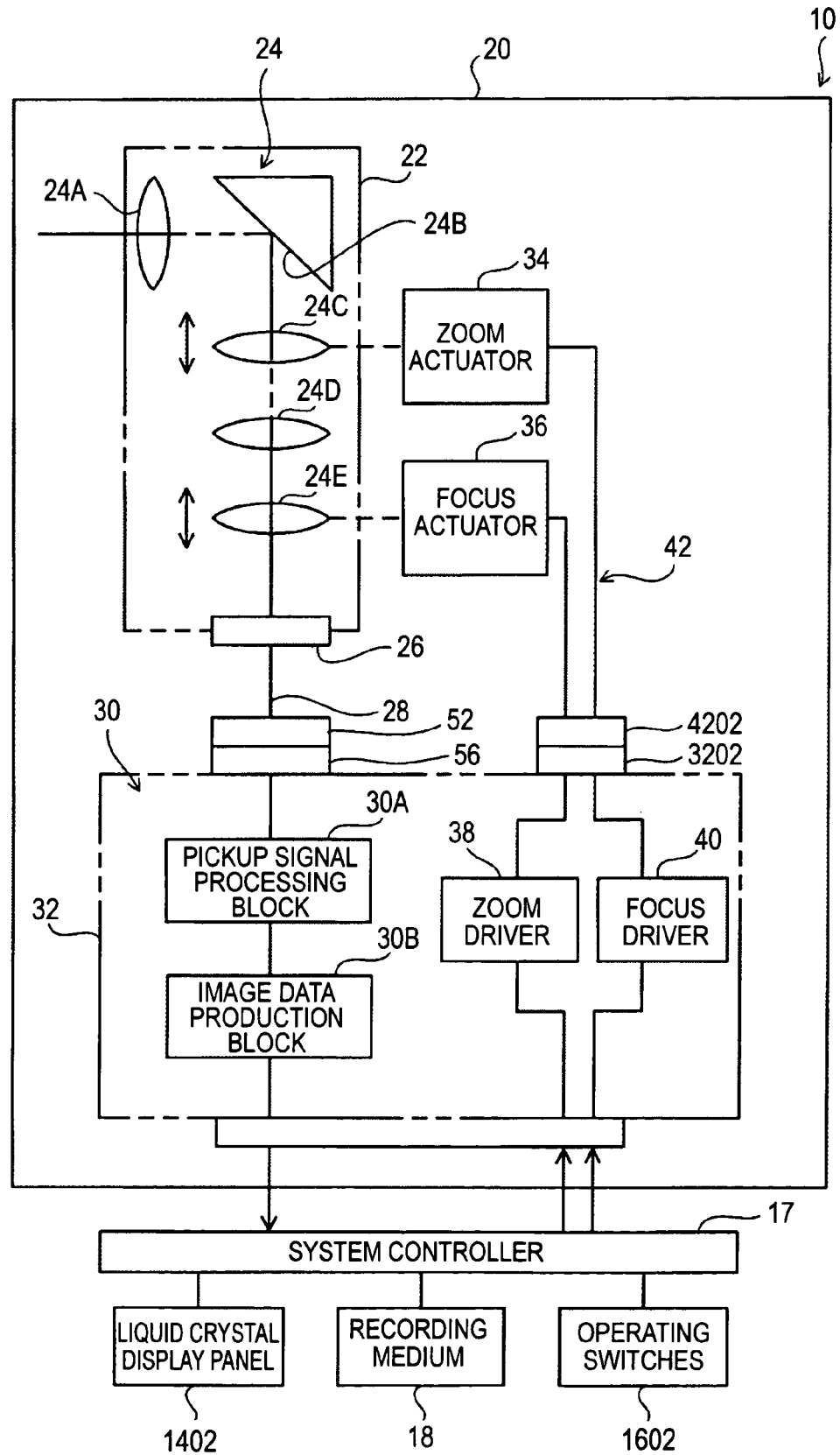

[FIG. 3]
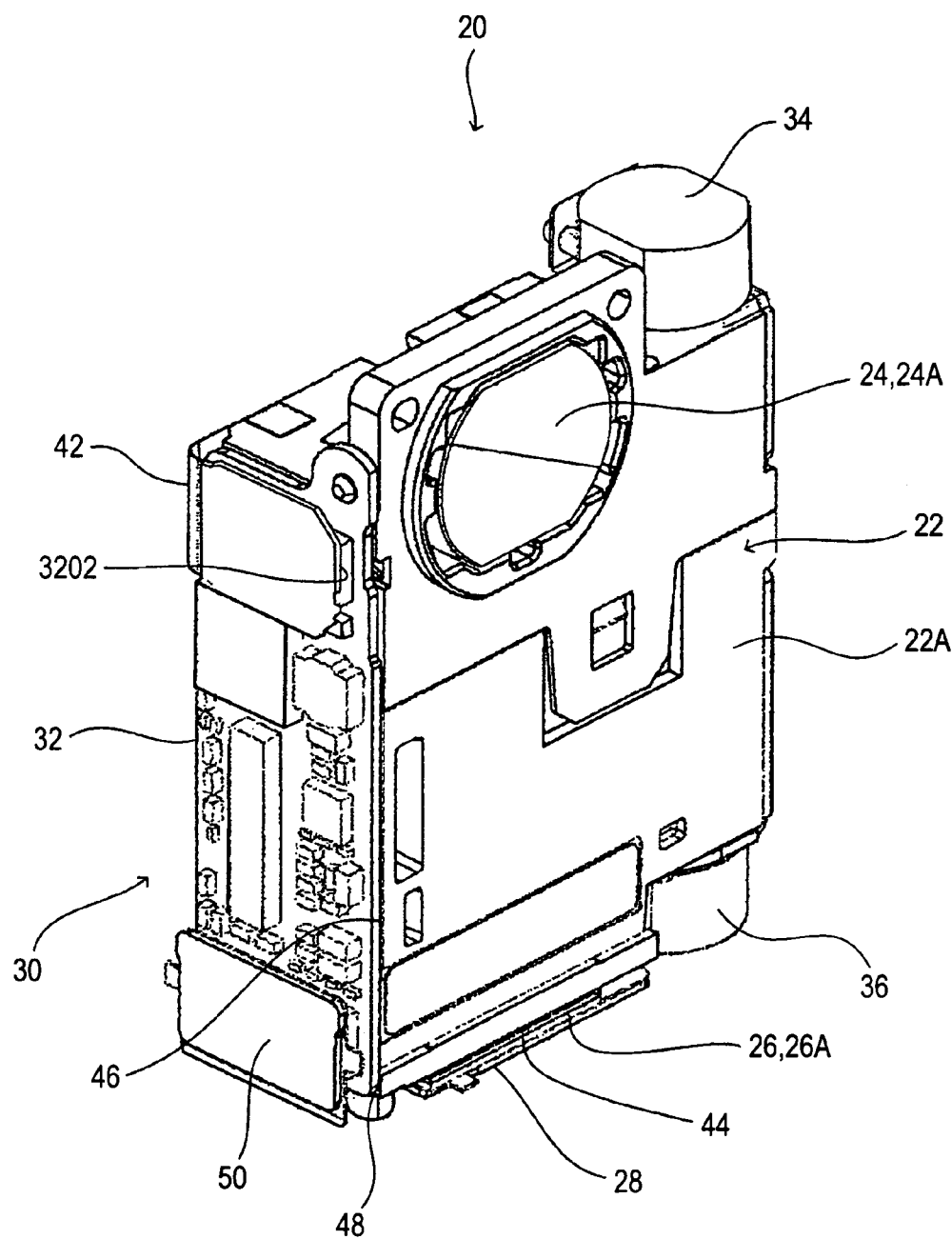

[FIG. 4]
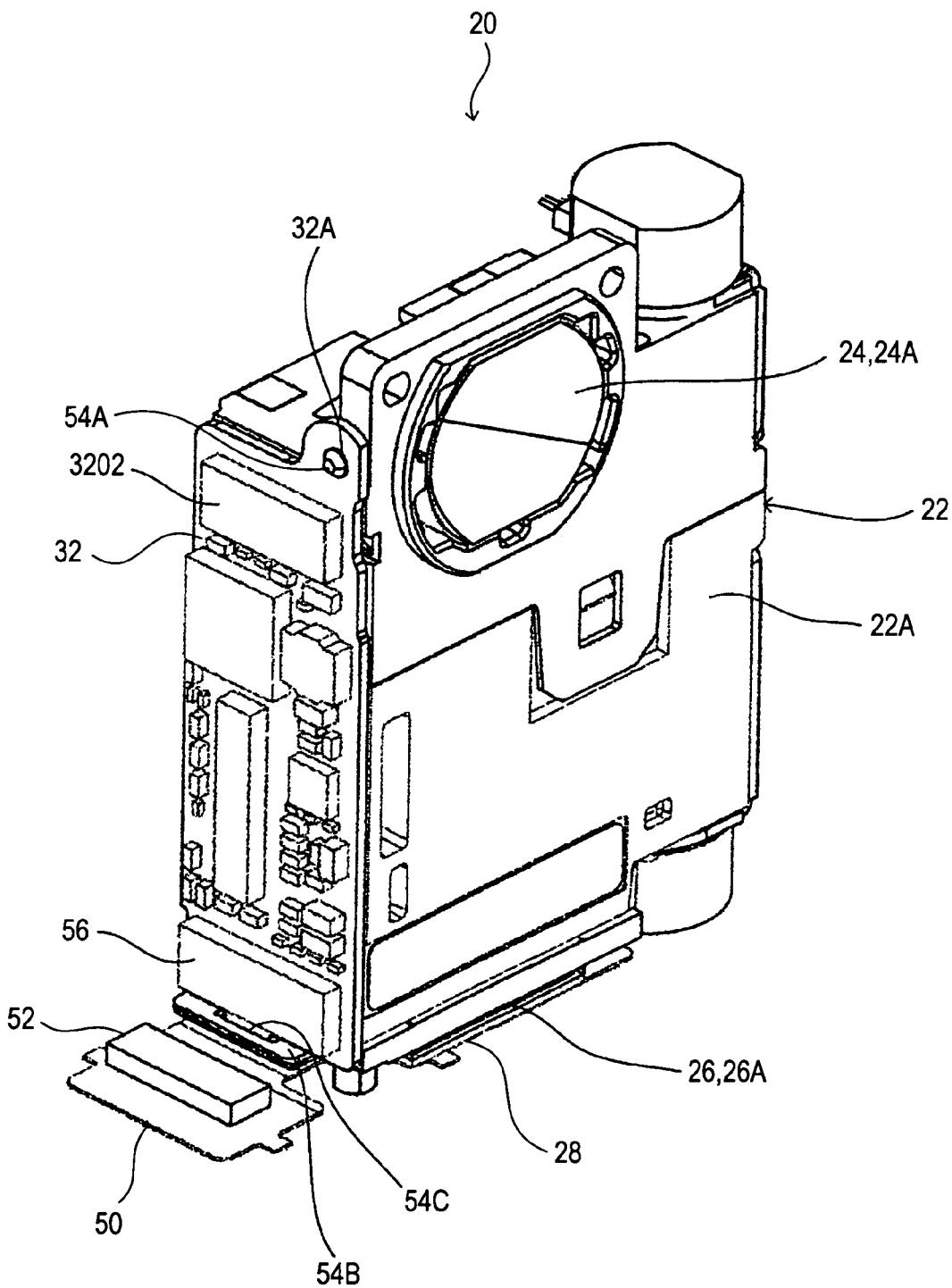

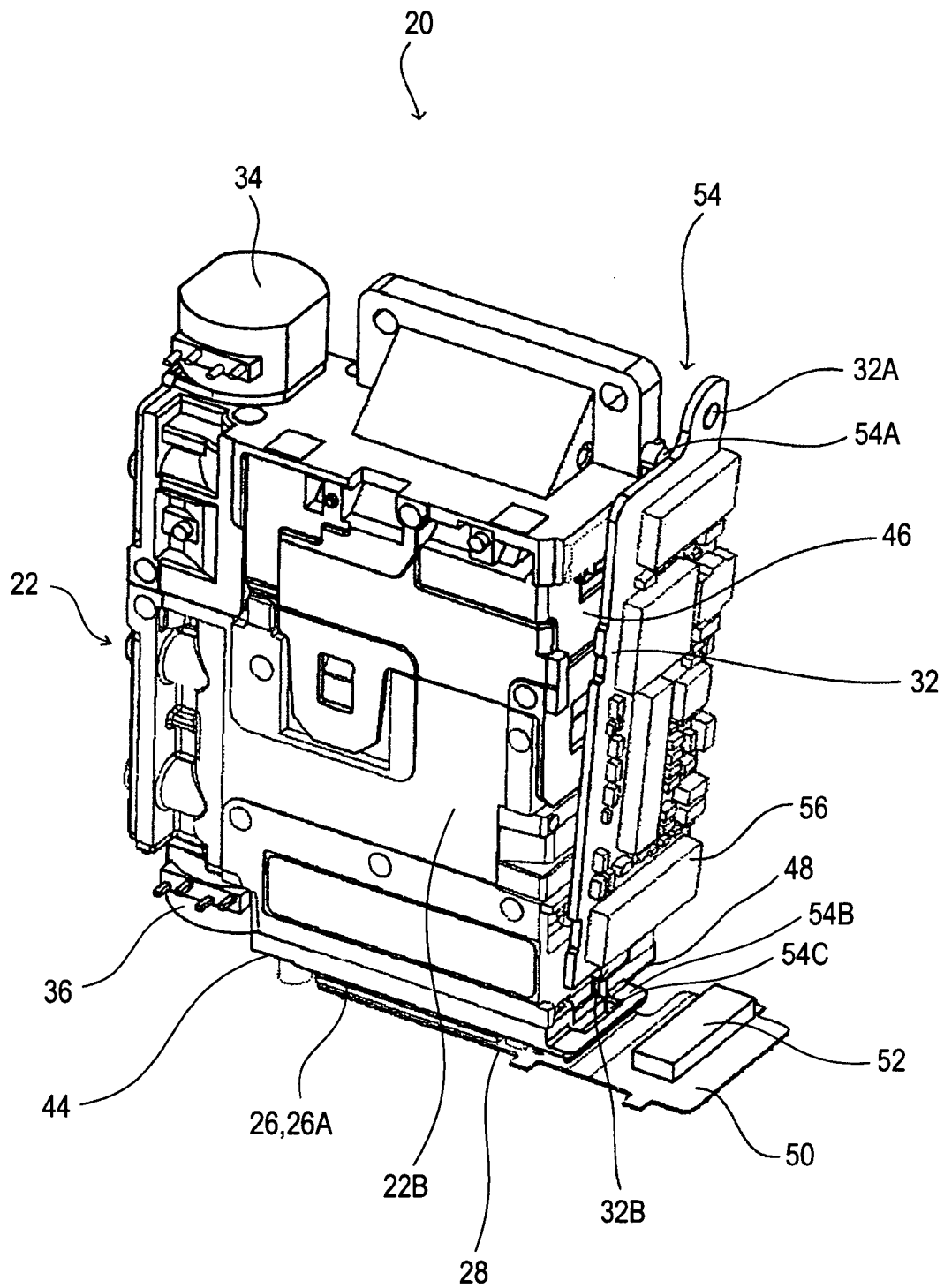
[FIG. 5]

[FIG. 6]
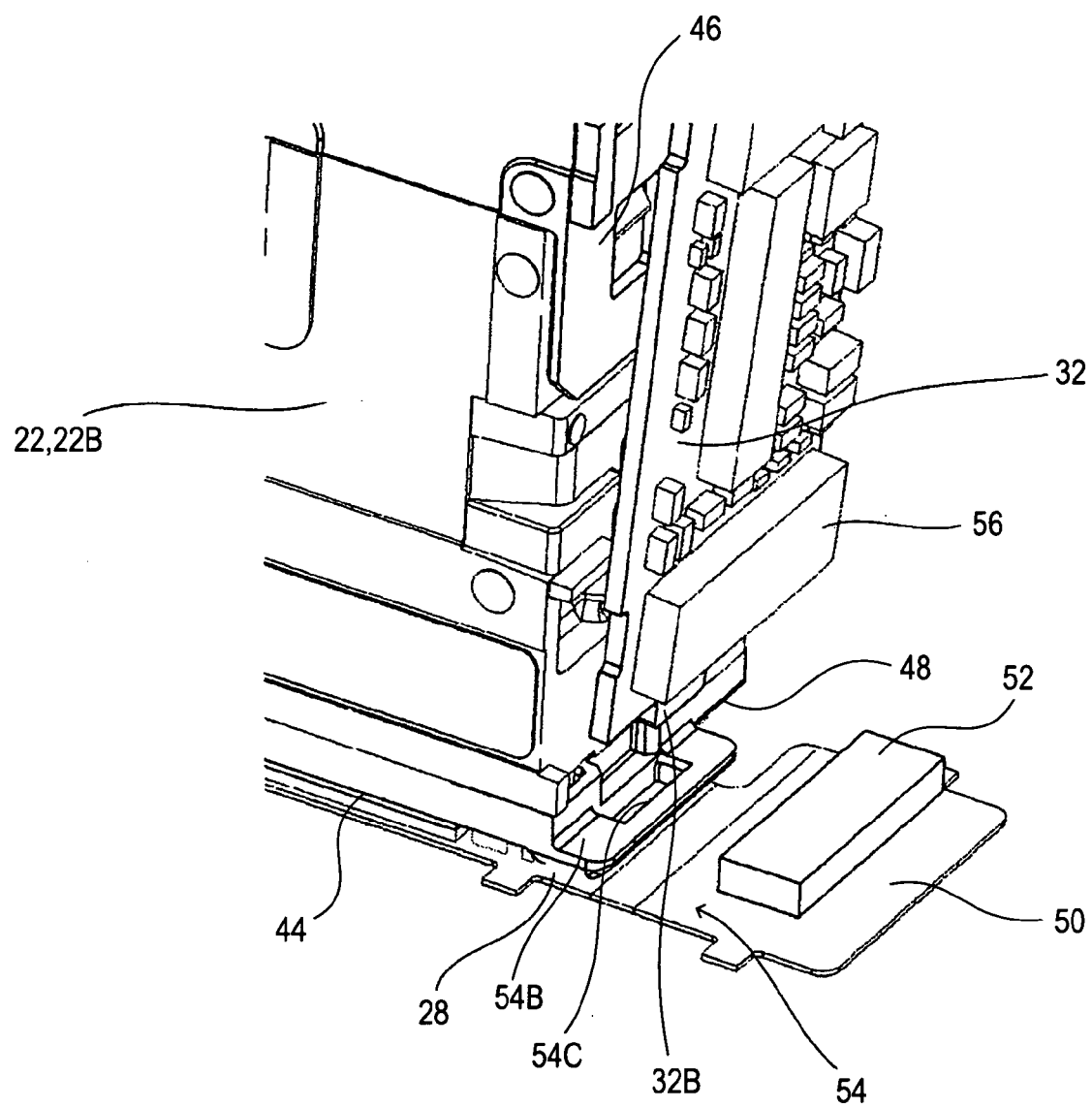

[FIG. 7]
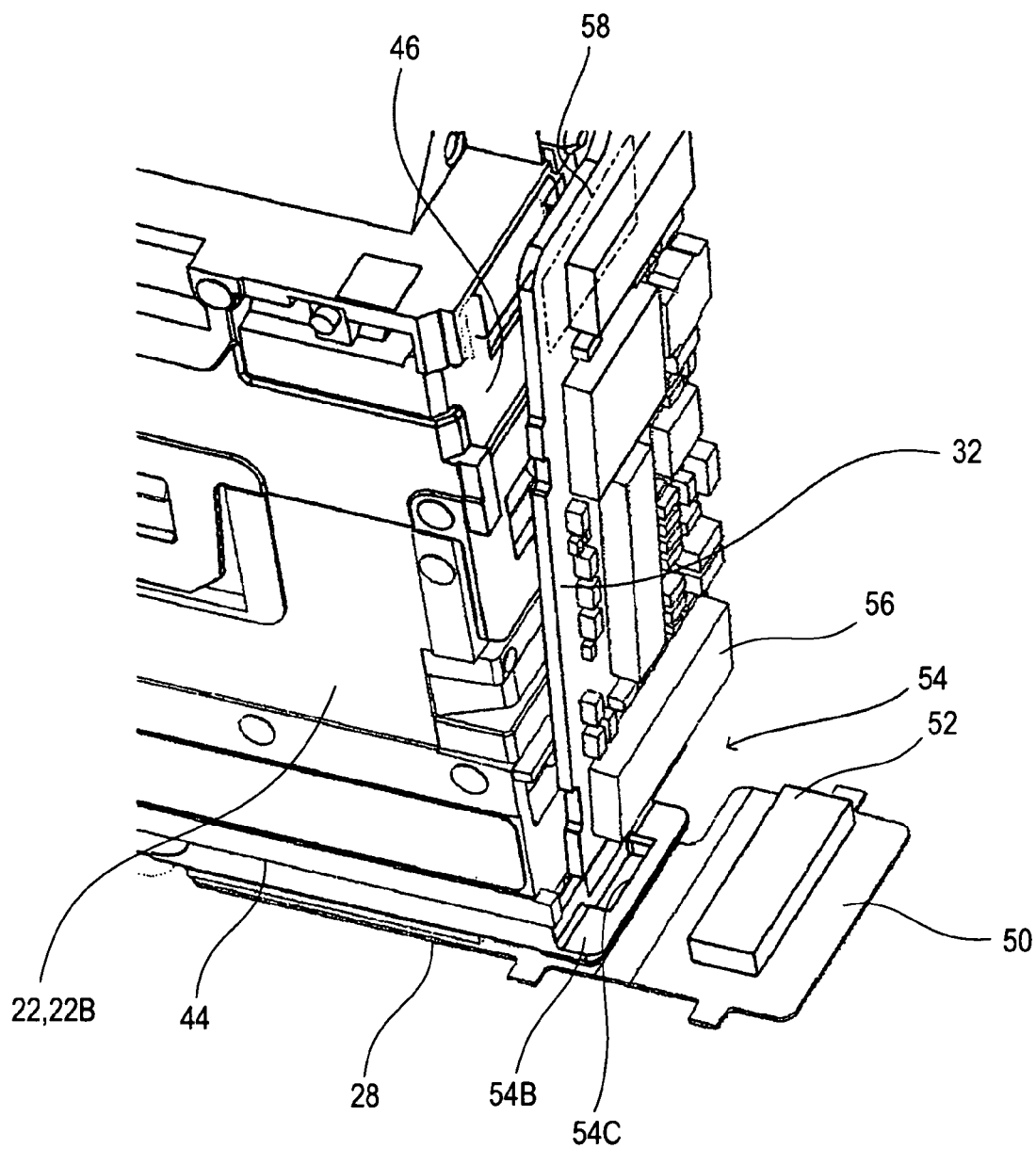

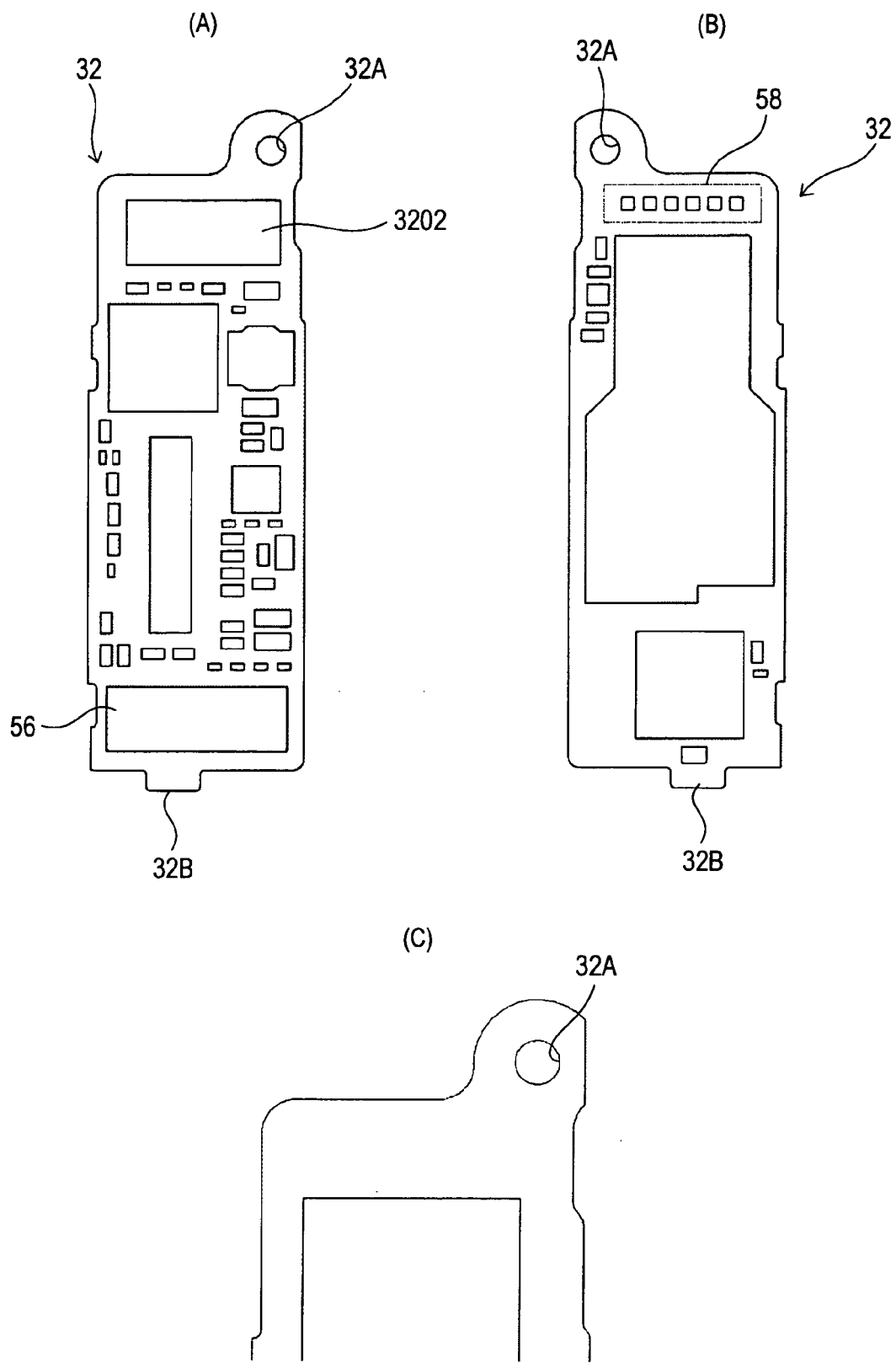
[FIG. 8]

[FIG. 9]
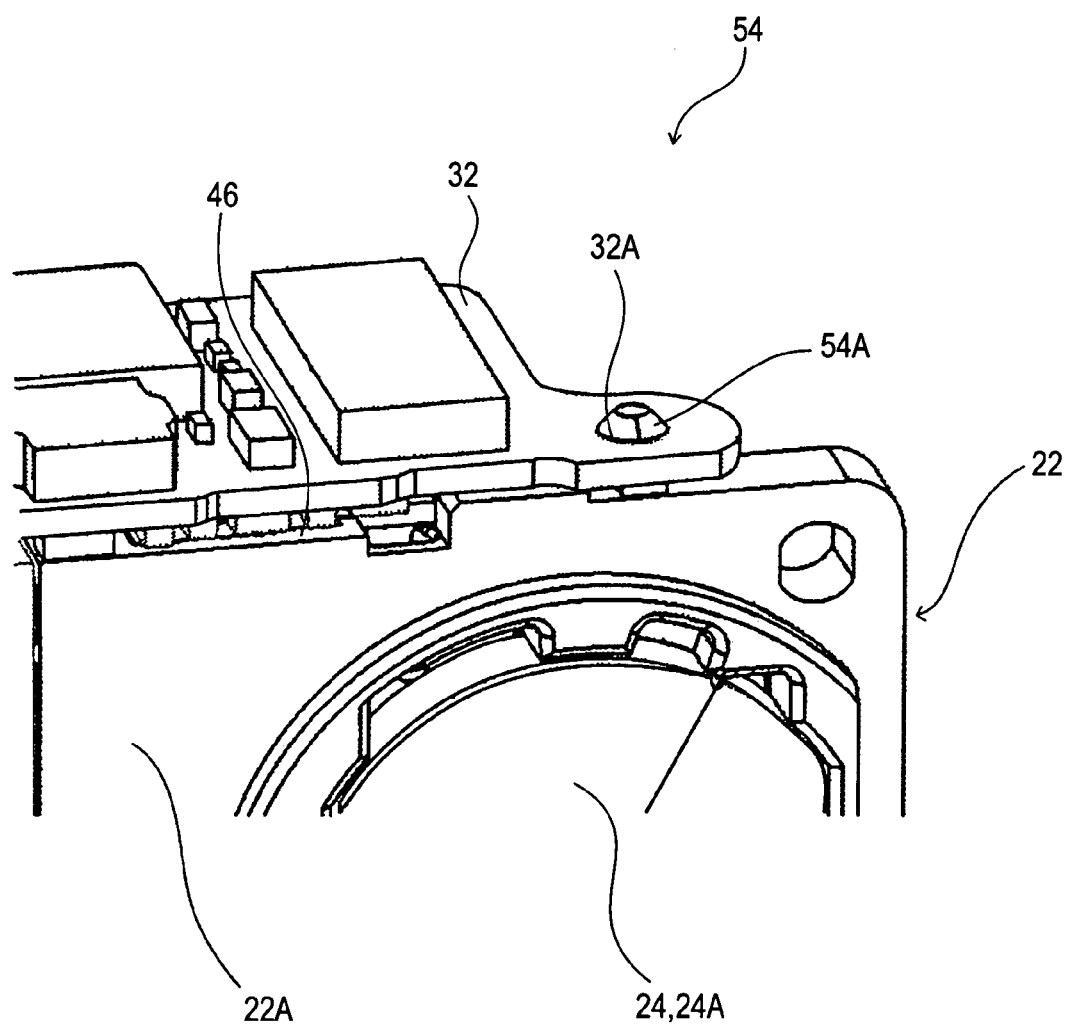

CAMERA MODULE AND IMAGING DEVICE

TECHNICAL FIELD

The present invention relates to a camera module and an imaging device.

BACKGROUND ART

In the past, a camera module including a lens barrel in which an imaging optical system is incorporated, an image sensor that picks up a subject image introduced by the imaging optical system, and a signal processing unit that performs predetermined signal processing on a pickup signal fed from the image sensor has been proposed (refer to JP-A-2000-207497).

In the camera module, presumably, the signal processing unit is formed in a rigid printed wiring substrate, the printed wiring substrate is attached to the flank of the lens barrel, and the pickup signal sent from the image sensor is routed to the printed wiring substrate by way of a flexible substrate. In this case, the connection between the flexible substrate and printed wiring substrate is achieved using connectors.

Incidentally, the pickup signal outputted from the image sensor is so feeble as to be susceptible to noise. The flexible substrate that transmits the pickup signal has to have the shortest length.

However, when the length of the flexible substrate gets shorter, the plasticity of the flexible substrate in a direction along the surface thereof is degraded. Therefore, when the printed wiring substrate is screwed and fixed to the lens barrel, there is a fear that a large stress may be imposed on the connectors through which the flexible substrate and printed wiring substrate are joined to each other, or the soldered parts of the connectors according to a variance in the attached positions of the printed wiring substrate and flexible substrate.

The present invention addresses the foregoing circumstance. An object of the present invention is to provide a camera module and electronic equipment that are advantageous in alleviating a stress to be imposed on connectors and a flexible substrate at the time of attaching a printed wiring substrate.

DISCLOSURE OF THE INVENTION

For accomplishing the above object, there is provided a camera module including a lens barrel in which an imaging optical system is incorporated, an image sensor that is attached to the lens barrel and picks up a subject image introduced by the imaging optical system, and a signal processing unit that performs predetermined signal processing on the pickup signal fed from the image sensor. The camera module is characterized in that: the image sensor has an imaging surface and a back surface located opposite to the imaging surface; the image sensor is mounted with the back surface thereof directed to a flexible substrate that transmits the pickup signal; the signal processing unit is formed on a rigid printed wiring substrate; the lens barrel has a first flank and a second flank which intersect each other; the image sensor is attached to the first flank with the imaging surface thereof directed to the first flank; the flexible substrate has a projecting portion that projects from an intersectional part, at which the first flank and second flank intersect each other, with the image sensor attached to the first flank; a flexible substrate-side connector of the flexible substrate is placed on the surface of the projecting portion flush with the surface of the flexible substrate to which the image sensor is attached; a temporary lock mechanism that temporarily locks the printed wiring substrate to such an extent that the position of the printed wiring substrate can be adjusted is formed on the second flank; the printed wiring substrate is disposed on the second flank via the temporary lock mechanism; a printed wiring substrate-side connector is placed on the surface opposite to the surface of the printed wiring substrate, which faces the second flank, at a position near the intersectional part on the printed wiring substrate disposed on the second flank; an adhesive layer is formed on the surface of the printed wiring substrate, which faces the second flank, at a position away from the printed wiring substrate-side connector; the projecting portion of the flexible substrate is folded at the intersectional part and the flexible substrate-side connector is coupled to the printed wiring substrate-side connector; the adhesive layer is bonded to the second flank; and the flexible substrate and printed wiring substrate are thus mounted on the lens barrel.

The present invention is an imaging device including a camera module. The imaging device is characterized in that: the camera module includes a lens barrel in which an imaging optical system is incorporated, an image sensor that is attached to the lens barrel and picks up a subject image introduced by the imaging optical system, and a signal processing unit that performs predetermined signal processing on a pickup signal fed from the image sensor; the image sensor has an imaging surface and a back surface located opposite to the imaging surface; the image sensor is mounted with the back surface thereof directed to a flexible substrate that transmits the pickup signal; the signal processing unit is formed on a rigid printed wiring substrate; the lens barrel has a first flank and a second flank that intersect each other; the image sensor is attached to the first flank with the imaging surface thereof directed to the first flank; the flexible substrate has a projecting portion that projects from an intersectional part, at which the first flank and second flank intersect each other, with the image sensor attached to the first flank; a flexible substrate-side connector of the flexible substrate is placed on the surface of the projecting portion flush with the surface of the flexible substrate to which the image sensor is attached; a temporary lock mechanism that temporarily locks the printed wiring substrate to such an extent that the position of the printed wiring substrate can be adjusted is formed on the second flank; the printed wiring substrate is disposed on the second flank via the temporary lock mechanism; a printed wiring substrate-side connector is placed on the surface opposite to the surface of the printed wiring substrate, which faces the second flank, at a position near the intersectional part on the printed wiring substrate disposed on the second flank; an adhesive layer is formed on the surface of the printed wiring substrate, which faces the second flank, at a position away from the printed wiring substrate-side connector; the projecting portion of the flexible substrate is folded at the intersectional part, and the flexible substrate-side connector is coupled to the printed wiring substrate-side connector; the adhesive layer is bonded to the second flank; and the flexible substrate and printed wiring substrate are thus mounted on the lens barrel.

According to the present invention, since the printed wiring substrate is temporarily locked using the temporary lock mechanism, a stress to be imposed on the flexible substrate-side connector, printed wiring substrate-side connector, and flexible substrate, printed wiring substrate is largely alleviated. In addition, the flexible substrate-side connector can be coupled to the printed wiring substrate-side connector. The projecting length of the projecting portion of the flexible substrate can be shortened.

BRIEF DESCRIPTION OF THE DRAWINGS

Parts (A) and (B) of FIG. 1 are appearance diagrams showing an example of an imaging device in which a camera module 20 in accordance with the embodiment is incorporated;

FIG. 2 is a block diagram showing the constitution of an imaging device 10;

FIG. 3 is an explanatory diagram of mounting of a printed wiring substrate 32 onto a lens barrel 22;

FIG. 4 is an explanatory diagram of mounting of the printed wiring substrate 32 onto the lens barrel 22;

FIG. 5 is an explanatory diagram of mounting of the printed wiring substrate 32 onto the lens barrel 22;

FIG. 6 is an explanatory diagram of mounting of the printed wiring substrate 32 onto the lens barrel 22;

FIG. 7 is an explanatory diagram of mounting of the printed wiring substrate 32 onto the lens barrel 22;

Part (A) of FIG. 8 is a plan view of the rigid printed wiring substrate 32, part (B) of FIG. 8 is a plan view in which the printed wiring substrate shown in part (A) is seen from an opposite side, and part (C) of FIG. 8 is an enlarged view of the major portion of the printed wiring substrate shown in part (B); and FIG. 9 is a perspective view showing part of a temporary lock mechanism 54.

BEST MODE FOR CARRYING OUT THE INVENTION

Referring to the drawings, an embodiment of the present invention will be described below.

Parts (A) and (B) of FIG. 1 are appearance diagrams showing an example of an imaging device in which a camera module in accordance with the present embodiment is incorporated.

As shown in FIG. 1, an imaging device 10 is a portable cellular phone and has first and second housings 14 and 16 that are coupled to each other so that they can pivot on a hinge section 12.

A liquid crystal display panel 1402 is disposed on the internal surface of the first housing 14, and operating switches 1602 including ten keys and function keys are disposed on the internal surface of the second housing 16.

The camera module 20 is incorporated in the proximal part of the first housing 14. An image picked up by the camera module 20 is displayed on the liquid crystal display panel 1402.

FIG. 2 is a block diagram showing the constitution of the imaging device 10.

The imaging device 10 includes, in addition to the camera module 20, liquid crystal display panel 1402, and operating switches 1602, a system controller 17 and a recording medium 18.

The system controller 17 displays on the liquid crystal display panel 1402 image data (still image data or motion picture data) fed from the camera module 20.

The system controller 17 performs recording of image data, which is fed from the camera module 20, in the recording medium or display of image data, which is read from the recording medium 18, on the liquid crystal display panel 1402. The recording medium 18 is realized with a memory incorporated in the imaging device 10 or a memory card capable of loaded or unloaded into or from a memory slot formed in the imaging device 10.

The system controller 17 receives an operation signal sent from the operating switches 1602 and controls the camera module 20.

The camera module 20 includes a lens barrel 22, an imaging optical system 24, an image sensor 26, a flexible substrate 28, a signal processing unit 30, and a rigid printed wiring substrate 32.

The lens barrel 22 has the imaging optical system 24 incorporated therein.

The imaging optical system 24 introduces a subject image into the image sensor 26.

In the present embodiment, the imaging optical system 24 includes an objective lens 24A located closest to a subject, a prism 24B that bends the optical path of the objective lens 24A at 90 degrees, a first movable lens 24C disposed below the prism 24B, an intermediate lens 24D, and a second movable lens 24E.

In the lens barrel 22, a zoom actuator 34 and a focus actuator 36 are incorporated.

The first movable lens 24C is moved in an optical-axis direction by the zoom actuator 34, whereby a zooming action of the imaging optical system 24 is carried out.

The second movable lens 24E is moved in the optical-axis direction by the focus actuator 36, whereby a focusing action of the imaging optical system 24 is carried out.

The image sensor 26 picks up a subject image introduced by the imaging optical system 24 so as to produce a pickup signal. Various image sensors that have been known in the past, such as, a CCD and a C-MOS sensor can be adopted.

The flexible substrate 28 feeds the pickup signal fed from the image sensor 26 into the signal processing unit 30.

The signal processing unit 30 includes a pickup signal processing block 30A and an image data production block 30B.

The pickup signal processing block 30A performs various pieces of signal processing that have been known in the past, such as, shading processing, color adjustment, gamma control, and sharpness processing on the pickup signal fed by way of the flexible substrate 28, and outputs the resultant signal as an image signal.

The image data production block 30B performs predetermined encoding or the like on the image signal fed from the pickup signal processing block 30A so as to produce image data in a predetermined format such as the JPEG format, and feeds the image data to the system controller 17.

The rigid printed wiring substrate 32 has a DSP and various electronic components mounted thereon, whereby the signal processing unit 30 is realized.

On the rigid printed wiring substrate 32, a zoom driver and a focus driver 40 are formed.

The zoom driver 38 and focus driver 40 operate based on a control signal fed from the system controller 17, produce drive signals to be fed to the zoom actuator 34 and focus actuator 36 respectively, and feed the drive signals by way of the flexible substrate 42 (FIG. 3). In FIG. 2, reference numeral 4202 denotes a connector of the flexible substrate 42, and reference numeral 3202 denotes a connector of the printed wiring substrate 32. The connectors 4202 and 3202 are coupled to each other.

In the lens barrel 22, position sensors that detect the positions of the first movable lens 24C and second movable lens 24E respectively are incorporated, through the position sensors are not shown. Detection signals sent from the position sensors are fed to the system controller 17 by way of the flexible substrate 42 and rigid printed wiring substrate 32.

The detection signals are used for the zooming action and focusing action instructed by the system controller 17.

Next, the pivotal portion of the present invention will be described below.

FIG. 3 to FIG. 7 are explanatory diagrams of mounting of the printed wiring substrate 32 on the lens barrel 22. Part (A) of FIG. 8 is a plan view of the rigid printed wiring substrate 32, part (B) of FIG. 8 is a plan view in which the printed wiring substrate shown in part (A) is seen from an opposite side, part (C) of FIG. 8 is an enlarged view of the major portion of the printed wiring substrate shown in part (B), and FIG. 9 is a perspective view showing part of the temporary lock mechanism 54.

As shown in FIG. 3 to FIG. 5, the lens barrel 22 has a flat shape with a rectangular front surface 22A and a rectangular back surface 22B located close to each other in parallel with each other.

The objective lens 24A is disposed on the front surface 22A.

The front surface 22A and back surface 22B are linked by a periphery, and the periphery includes four flanks.

In the present embodiment, as shown in FIG. 5, a flank located opposite to the zoom actuator 34 and focus actuator 36 is the first flank 44, and a flank located opposite to the objective lens 24A is the second flank 46. The first flank 44 and second flank 46 intersect each other (intersect at 900 in the present embodiment).

The image sensor 26 has an imaging surface and a back surface 26A located opposite to the imaging surface.

As shown in FIG. 3, the image sensor 26 is mounted with the back surface 26A thereof directed to the flexible substrate.

The signal processing unit 30 is, as mentioned above, formed on the rigid printed wiring substrate 32.

The image sensor 26 is attached to the first flank 44 with the imaging surface thereof directed thereto.

As shown in FIG. 5 and FIG. 6, the flexible substrate 28 has a projecting portion 50 that projects from an intersectional part 48, at which the first flank 44 and second flank 46 intersect each other, with the image sensor 26 attached to the first flank 44.

A flexible substrate-side connector 52 of the flexible substrate 28 is placed on the surface of the projecting portion 50 flush with the surface of the flexible substrate 28 to which the image sensor 26 is attached.

As shown in FIG. 5, the second flank 46 has a width along the ridge of the intersectional part 48, and a length in a direction of receding from the intersectional part 48.

A temporary lock mechanism 54 is formed on the second flank 46, and the printed wiring substrate 32 is disposed on the second flank 46 via the temporary lock mechanism 54.

The printed wiring substrate 32 has the same width and length as the second flank 46.

The temporary lock mechanism 54 temporarily locks the printed wiring substrate 32 on the second flank 46 to such an extent that the position of the printed wiring substrate can be adjusted.

The temporary lock mechanism 54 includes, as shown in FIG. 4, FIG. 5, and FIG. 9, a shaft 54A that juts out of the end portion of the second flank 46 in the length direction thereof which is located opposite to the intersectional part 48, a wall portion 54B that juts out of the end portion of the second flank 46 in the length direction thereof on the side of the intersectional part 48 and extends in a direction parallel to the ridge of the intersectional part 48, and an elongated hole 54C formed in the wall portion 54B to extend in a direction parallel to the ridge of the intersectional part 48.

The printed wiring substrate 32 is provided with a temporary lock hole 32A into which the shaft 54A is, as shown in FIG. 5 and parts (A) and (B) of FIG. 8, loosely fitted, and a temporary lock support piece 32B that is, as shown in FIG. 6, inserted into the elongated hole 54C so that the movement of the temporary lock support piece in an extending direction of the elongated hole 54C can be adjusted and the movement thereof in a direction of receding from or approaching the second flank 46 can be adjusted.

Temporary lock of the printed wiring substrate 32 is achieved by, as shown in FIG. 9, loosely fitting the shaft 54A into the temporary lock hole 32A, and by, as shown in FIG. 5 to FIG. 7, inserting the temporary lock support piece 32B into the elongated hole 54C. Thus, the printed wiring substrate 32 is temporary locked onto the second flank 46.

As shown in FIG. 5, the printed wiring substrate-side connector 56 is placed on the surface opposite to the surface of the printed wiring substrate 32, which faces the second flank 46, at a position near the intersectional part 48 on the printed wiring substrate 32 disposed on the second flank 46.

In the present embodiment, the printed wiring substrate-side connector 56 is placed on the end portion of the printed wiring substrate 32 in the length direction thereof which is located on the side of the intersectional part 48. The printed wiring substrate-side connector 56 is extended in the width direction of the printed wiring substrate 32.

As shown in part (B) of FIG. 8, an adhesive layer 58 is formed on the surface of the printed wiring substrate 32, which faces the second flank 46, at a position away from the printed wiring substrate-side connector 56.

In the present embodiment, the adhesive layer 58 is disposed on the end portion of the printed wiring substrate 32, which is disposed on the second flank 46, located opposite to the intersectional part 48, and formed in a rectangular area whose long sides extend in the width direction of the printed wiring substrate 32.

As shown in FIG. 3, the projecting portion 50 of the flexible substrate 28 is folded at the intersectional part 48, and the flexible substrate-side connector 52 is coupled to the printed wiring substrate-side connector 56. As shown in FIG. 7, the adhesive layer 58 is bonded to the second flank 46. Thus, the flexible substrate 28 and printed wiring substrate 32 are mounted on the lens barrel 22.

According to the present embodiment, the printed wiring substrate 32 is temporarily locked by the temporary lock mechanism 54. When the flexible substrate-side connector 52 is coupled to the printed wiring substrate-side connector 56, the printed wiring substrate-side connector 56 can be finely adjusted. Therefore, coupling the flexible substrate-side connector 52 to the printed wiring substrate-side connector 56 can be readily smoothly achieved.

Therefore, while a stress to be imposed on the flexible substrate-side connector 52, printed wiring substrate-side connector 56, flexible substrate 28, and printed wiring substrate 32 can be largely alleviated, the flexible substrate-side connector 52 can be coupled to the printed wiring substrate-side connector 56.

The printed wiring substrate-side connector 56 can be finely adjusted, and the flexible substrate-side connector 52 can be readily smoothly coupled to the printed wiring substrate-side connector 56. Therefore, the projecting length of the projecting portion 50 of the flexible substrate can be reduced. Since the projecting length of the projecting portion 50 of the flexible substrate 28 can thus be reduced, an adverse effect of noise on a feeble pickup signal to be transmitted through the printed wiring substrate 32 can be suppressed. This is advantageous in improving the quality of the pickup image.

Since the adhesive layer 58 is located at a position away from the printed wiring substrate-side connector 56, the adhesive layer 58 can be prevented from being bonded to the second flank 46 when the flexible substrate-side connector 52 is coupled to the printed wiring substrate-side connector 56. After the flexible substrate-side connector 52 is coupled to the printed wiring substrate-side connector 56, the printed wiring substrate 32 can be aligned with the second flank 46 and then attached to the second flank 46. This is advantageous in improving workability.

In the present embodiment, the lens barrel 22 of the camera module 20 has a flat shape with the front surface 22A and back surface 22B located close to each other. The objective lens 24A is disposed on the front surface 22A. The first flank 44 and second flank 46 constitute part of the periphery that links the front surface 22A and back surface 22B. The printed wiring substrate 32 is attached to the second flank 46. Therefore, the dimension in a direction of linking the front surface 22A of the lens barrel 22 and the back surface 22B thereof can be reduced. This is advantageous in achieving the thin shape of the first housing 14 in which the camera module is incorporated.

The invention claimed is:

1. A camera module comprising:
   a lens barrel in which an imaging optical system is incorporated;
   an image sensor that is attached to the lens barrel and picks up a subject image introduced by the imaging optical system; and
   a signal processing unit that performs predetermined signal processing on the pickup signal fed from the image sensor, wherein:
   the image sensor has an imaging surface and a back surface located opposite to the imaging surface;
   the image sensor is mounted with the back surface thereof directed to a flexible substrate that transmits the pickup signal;
   the signal processing unit is formed on a rigid printed wiring substrate;
   the lens barrel has a first flank and a second flank that intersect each other;
   the image sensor is attached to the first flank with the imaging surface thereof directed to the first flank;
   the flexible substrate has a projecting portion that projects from an intersectional part, at which the first flank and second flank intersect each other, with the image sensor attached to the first flank;
   a flexible substrate-side connector of the flexible substrate is placed on the surface of the projecting portion flush with the surface of the flexible substrate to which the image sensor is attached;
   a temporary lock mechanism that temporarily locks the printed wiring substrate to such an extent that the position of the printed wiring substrate can be adjusted is formed on the second flank;
   the printed wiring substrate is disposed on the second flank via the temporary lock mechanism;
   a printed wiring substrate-side connector is placed on the surface opposite to the surface of the printed wiring substrate, which faces the second flank, at a position near the intersectional part on the printed wiring substrate disposed on the second flank, and an adhesive layer is formed on the surface of the printed wiring substrate, which faces the second flank, at a position away from the printed wiring substrate-side connector; and
   the projecting portion of the flexible substrate is folded at the intersectional part, the flexible substrate-side connector is coupled to the printed wiring substrate-side connector, the adhesive layer is bonded to the second flank, and the flexible substrate and printed wiring substrate are thus mounted on the lens barrel.

2. The camera module according to claim 1, wherein the printed wiring substrate-side connector is placed on the end portion of the printed wiring substrate, which is disposed on the second flank, located near the intersectional part.

3. The camera module according to claim 1, wherein:
   the second flank has a length in a direction of receding from the intersectional part;
   the printed wiring substrate has the same length as the second flank; and
   the printed wiring substrate-side connector is placed on the end portion of the printed wiring substrate in the length direction thereof which is located on the side of the intersectional part.

4. The camera module according to claim 1, wherein the adhesive layer is formed on the end portion of the printed wiring substrate, which is disposed on the second flank, located opposite to the intersectional part.

5. The camera module according to claim 1, wherein:
   the second flank has a length in a direction of receding from the intersectional part;
   the printed wiring substrate has the same length as the second flank; and
   the adhesive layer is formed on the end portion of the printed wiring substrate in the length direction thereof which is located opposite to the intersectional part.

6. The camera module according to claim 1, wherein:
   the second flank has a width along with the ridge of the intersectional part and has a length in a direction of receding from the intersectional part;
   the printed wiring substrate has the same width and length as the second flank; and
   the printed wiring substrate-side connector is extended in the width direction of the printed wiring substrate.

7. The camera module according to claim 1, wherein:
   the second flank has a length in a direction of receding from the intersectional part;
   the temporary lock mechanism includes a shaft that is jutted out of the end portion of the second flank in the length direction thereof which is located opposite to the intersectional part, a wall portion that is jutted out of the end portion of the second flank in the length direction thereof on the side of the intersectional part and that is extended in a direction parallel to the ridge of the intersectional part; and an elongated hole formed in the wall portion so as to extend in the direction parallel to the ridge of the intersectional part;
   the printed wiring substrate has a temporary lock hole into which the shaft is loosely fitted, and a temporary lock support piece that is inserted into the elongated hole so that the movement of the temporary lock support piece in the extending direction of the elongated hole can be adjusted and the movement thereof in a direction of receding from or approaching the second flank can be adjusted; and
   temporary lock of the printed wiring substrate is achieved by loosely fitting the shaft into the temporary lock hole and inserting the temporary lock support piece into the elongated hole.

8. The camera module according to claim 1, wherein:
the lens barrel has a flat shape with the front surface and back surface thereof located close to each other;
the imaging optical system includes an objective lens located closest to a subject;
the objective lens is disposed on the front surface; and
the first flank and second flank constitute part of the periphery linking the front surface and back surface.

9. An imaging device including a camera module, wherein:
the camera module includes a lens barrel in which an imaging optical system is incorporated, an image sensor that is attached to the lens barrel and picks up a subject image introduced by the imaging optical system, and a signal processing unit that performs predetermined signal processing on a pickup signal fed from the image sensor;
the image sensor has an imaging surface and a back surface located opposite to the imaging surface;
the image sensor is mounted with the back surface thereof directed to a flexible substrate that transmits the pickup signal;
the signal processing unit is formed on a rigid printed wiring substrate;
the lens barrel has a first flank and a second flank that intersect each other;
the image sensor is attached to the first flank with the imaging surface thereof directed to the first flank;
the flexible substrate has a projecting portion that projects from an intersectional part, at which the first flank and second flank intersect each other, with the image sensor attached to the first flank;
a flexible substrate-side connector of the flexible substrate is placed on the surface of the projecting portion flush with the surface of the flexible substrate to which the image sensor is attached;
a temporary lock mechanism that temporarily locks the printed wiring substrate to such an extent that the position of the printed wiring substrate can be adjusted is formed on the second flank;
the printed wiring substrate is disposed on the second flank via the temporary lock mechanism;
a printed wiring substrate-side connector is placed on the surface opposite to the surface of the printed wiring substrate, which faces the second flank, at a position near the intersectional part on the printed wiring substrate disposed on the second flank, and an adhesive layer is formed on the surface of the printed wiring substrate, which faces the second flank, at a position away from the printed wiring substrate-side connector; and
the projecting portion of the flexible substrate is folded at the intersectional part, the flexible substrate-side connector is coupled to the printed wiring substrate-side connector, the adhesive layer is bonded to the second flank, and the flexible substrate and printed wiring substrate are thus mounted on the lens barrel.

* * * * *